US009124061B2

(12) United States Patent  
Essaian et al.

(10) Patent No.: US 9,124,061 B2  
(45) Date of Patent: Sep. 1, 2015

(54) PROJECTION RGB-LASER LIGHT SOURCE WITH STABILIZED COLOR BALANCE

(71) Applicant: Spectralus Corporation, Santa Clara, CA (US)

(72) Inventors: Stephan Essaian, San Jose, CA (US); Dzhakhangir V. Khaydarov, Campbell, CA (US)

(73) Assignee: Spectralus Corporation, San Jose, CA (US)

( * ) Notice: Subject to any disclaimer, the term of this patent is extended or adjusted under 35 U.S.C. 154(b) by 0 days.

(21) Appl. No.: 14/275,353

(22) Filed: May 12, 2014

(65) Prior Publication Data

US 2014/0341241 A1   Nov. 20, 2014

Related U.S. Application Data

(60) Provisional application No. 61/823,205, filed on May 14, 2013.

(51) Int. Cl.

| | |
|---|---|
| *H01S 3/04* | (2006.01) |
| *H01S 5/024* | (2006.01) |
| *G02B 27/48* | (2006.01) |
| *H01S 5/40* | (2006.01) |
| *H01S 5/00* | (2006.01) |
| *H01S 5/022* | (2006.01) |
| *H01S 5/14* | (2006.01) |

(52) U.S. Cl.  
CPC ............ *H01S 5/02415* (2013.01); *G02B 27/48* (2013.01); *H01S 5/4093* (2013.01); *H01S 5/0092* (2013.01); *H01S 5/02288* (2013.01); *H01S 5/141* (2013.01)

(58) Field of Classification Search  
CPC ... H01S 3/0627; H01S 3/09415; H01S 3/109; H01S 3/1611; H01S 3/1673; H01S 5/0014; H01S 5/0021; H01S 5/0071; H01S 5/0206; H01S 5/02228; H01S 5/0224; H01S 5/02415  
USPC .......................................................... 372/34  
See application file for complete search history.

(56) References Cited

U.S. PATENT DOCUMENTS

| 5,966,394 | A  | * | 10/1999 | Spurr et al. ...................... 372/34 |
|---|---|---|---|---|
| 7,413,635 | B2 |   | 8/2008  | Essaian |
| 7,478,955 | B2 | * | 1/2009  | Murry et al. .................... 385/92 |
| 7,545,493 | B2 | * | 6/2009  | Wang et al. .................... 356/301 |
| 7,570,676 | B2 |   | 8/2009  | Essaian et al. |
| 7,724,797 | B2 |   | 5/2010  | Essaian et al. |
| 7,742,510 | B2 |   | 6/2010  | Essaian et al. |
| 7,924,349 | B2 | * | 4/2011  | Tan et al. ....................... 348/744 |
| 8,000,357 | B2 |   | 8/2011  | Essaian et al. |
| 8,107,035 | B2 | * | 1/2012  | Stuart et al. .................... 349/64 |
| 8,384,620 | B2 | * | 2/2013  | Brown et al. ................... 345/31 |

(Continued)

*Primary Examiner* — Tod T Van Roy  
*Assistant Examiner* — Vu A Vu  
(74) *Attorney, Agent, or Firm* — Gardner, Linn, Burkhart & Flory, LLP

(57) ABSTRACT

A laser light source includes a thermoelectric cooling device, a composite green laser made up of an infrared wavelength pumped laser diode and a solid-state laser cavity designed for efficient nonlinear intra-cavity frequency conversion into desired wavelengths using periodically poled nonlinear crystals thermally coupled with the cooling device and a red wavelength laser diode thermally coupled with said cooling device. In this manner, the cooling device maintains a common temperature of the infrared pumped laser diode and the red laser diode over an ambient temperature range.

15 Claims, 9 Drawing Sheets

(56) References Cited

U.S. PATENT DOCUMENTS

| | | |
|---|---|---|
| 8,649,404 B2 | 2/2014 | Essaian et al. |
| 2008/0259431 A1* | 10/2008 | Weichmann et al. ......... 359/237 |
| 2010/0149222 A1* | 6/2010 | Welford et al. ............... 345/690 |
| 2011/0234919 A1* | 9/2011 | Sprague et al. ............... 348/744 |
| 2012/0051382 A1* | 3/2012 | Miao ............................ 372/50.1 |
| 2013/0250983 A1 | 9/2013 | Essaian et al. |
| 2013/0272324 A1* | 10/2013 | Williamson et al. ............ 372/22 |

* cited by examiner

PROJECTION RGB-LASER LIGHT SOURCE WITH STABILIZED COLOR BALANCE

CROSS REFERENCE TO RELATED APPLICATION

This application claims priority from U.S. provisional patent application Ser. No. 61/823,205, filed on May 14, 2013, the disclosure of which is hereby incorporated herein by reference in its entirety.

BACKGROUND OF THE INVENTION

The present invention is directed to an RGB laser light source and, in particular, to such a source that provides color balance over a wide temperature range.

Pico or compact projectors become more and more popular. There are two competing technologies to generate light in these projectors. One of them is using light-emitting diodes (LED) and another—lasers. While LEDs offer low cost, overall efficiency of the LED-based projectors is rather low because of the difficulties to collect light that is emitted by LED in a very broad angle. Projectors based on lasers offer considerably higher overall efficiency and much wider color range producing vivid life-like images with saturated colors.

Laser-based pico projectors utilize two architectures: scanning minor (low brightness of up to 20 lumens, limited by the eye safety regulations) and field sequential display panel (DLP or LCOS with much higher brightness of up to 280 lumens) [E. Buckley, Journal of the SID, V. 18, P. 944 and P. 1051 (2010)]. As most of display devices, laser projectors create images utilizing three primary colors: Red, Green, and Blue (RGB). Red (wavelength of about ~640 nm) and Blue (~450 nm) colors are produced by direct semiconductor laser diodes (LDs). Red LDs are based on gallium arsenide (GaAs) material and Blue LDs are based on gallium nitride (GaN). Samples of direct Green semiconductor laser diodes based on GaN with a wavelength of about 520 nm with low power of about ~50 mW, just recently became available and used in the projectors based on scanning minor architecture. Composite Green lasers with wavelength of about 532 nm are based on the second harmonic generation in nonlinear crystal. Composite lasers that deliver much power of 500 mW and higher, are used in the panel-based projectors.

One of the most important parameters for any consumer electronics device is operating temperature range that defines range of ambient temperatures where specifications are met. This range varies depending on the design of the projectors. The LED-based projectors have a wider range in comparison with the laser-based ones. Such a difference is due to the fact that Red laser output parameters, such as wavelength and power, depend on its case temperature. The wide ambient temperature range of projector operation from 0° C. to 35° C. is illustrative. Temperature inside the projector is about 15° C. higher because of the heat dissipated by the lasers and driver electronics. Thus, operating temperature range of the laser case inside the package may be 35° C., from 15° C. to 50° C. As it happens, case temperature affects Red and Blue LD operation in a subtly different way. Both cases are considered below.

In case of Blue LD, wavelength varies with the case temperature almost linearly (assuming fixed output power specified for the particular LD) with the slope of about 0.04 nm/° C. The overall wavelength change is about 1.4 nm. Wavelength increases with the temperature and going to the higher sensitivity range of the human eye. However, change in the wavelength is rather small and basically does not affect color balance of the projected images. The operating current increases with the temperature to maintain output power, however, reduction of the voltage across LD keeps power conversion efficiency (PCE) almost the same across the whole range. Constant PCE means that heat dissipated by the Blue laser remains about the same across the whole range. Green LDs that are based on the same material GaN as the Blue ones behave similarly. However, specified output power of the Green LDs is rather limited and declines at elevated temperatures.

Output wavelength of Red LDs increases with temperature about five times faster than that for the Blue LD. An average slope is about 0.2 nm/° C. However, it could be as high as 0.4 nm/° C. at higher temperatures in high-power assemblies. As ambient temperature increases, the wavelength of the Red LD becomes longer. Human eye sensitivity in the Red range decreases rather fast as wavelength increases. It means that output power of the Red LD must be higher to maintain brightness and color balance. This requires higher LD current that leads to the higher heat dissipation inside the projector package, which contributes to further internal temperature increase in comparison with the ambient.

Data in Table 1 is calculated for a pico projector with 40 lumens of brightness utilizing a Red LD in the pulsed mode of operation. The main conclusion from the data in the Table 1 is that, at higher ambient temperatures, power consumption of the Red LD increases more than two times from about 730 mW to about 1760 mW. It is more than 1 W power consumption/dissipation increase. This is a very high power consumption jump for a compact device powered by the battery. Table 1 gives a somewhat optimistic estimate because additional temperature increase due to the higher power dissipation has not been taken into account. That additional temperature increase is estimated to be as high as 25%-30% of that for the operation at low temperatures. In this case, power consumption for the Red LD would increase up to about 2W. It would be almost three times higher than power consumption at low temperatures.

TABLE 1

Power consumption of the Red LD depending on the ambient temperature in the 40 lm pico projector.

| Ambient Temperature ° C. | LD Case Temperature ° C. | Wavelength nm | Red LD PCE % | Average (Pulsed) Output Power, mW of Red LD | Power consumption by Red LD mW |
|---|---|---|---|---|---|
| 0 | 15 | 635 | 35% | 255.25(1021) | 729 |
| 20 | 35 | 639 | 23% | 296.25(1185) | 1288 |
| 35 | 50 | 642 | 19% | 334.75(1339) | 1762 |

The wavelength of the Red LD can be stabilized to avoid thermal runaway in a portable device, while maintaining color balance either by using a thermal electric cooler (TEC) device and an external volume Bragg grating placed in the package or an internal grating integrated in Red LD chip structure. However, the external volume Bragg grating involves additional components, which would increase cost and volume of the package. The internal grating would add complexity in processing of LD at production process and increase the production cost.

On the other hand, the most efficient Green composite laser that was specifically designed for projection applications and used in many pico-projectors and prototypes already has TEC on board. It allows maintaining Green laser performance in a broad ambient temperature range from −30° C. to +60° C.

Such laser may be provided as a compact optically-pumped solid-state laser designed for efficient nonlinear intra-cavity frequency conversion into desired wavelengths using periodically poled nonlinear crystals. Such device is disclosed in commonly assigned U.S. Pat. No. 7,742,510, the disclosure of which is hereby incorporated herein by reference. The laser is highly efficient and its miniature package has been specifically designed to fit in the pico projectors. The 808 nm and 880 nm IR pump LD in the Green composite laser is based on GaAs, the same material as in Red LD. It means that both IR and Red LDs can be handled and mounted using the same processes.

SUMMARY OF THE INVENTION

A laser light source, according to an aspect of the invention, includes a thermoelectric cooling device (TEC), a Composite Green laser made up of an infrared wavelength pumped laser diode and a solid-state laser cavity designed for efficient nonlinear intra-cavity frequency conversion into desired wavelengths using periodically poled nonlinear crystals thermally coupled with the cooling device (TEC) and a Red wavelength laser diode thermally coupled with said cooling device. In this manner, the cooling device maintains a common temperature of the infrared pumped laser diode and the Red laser diode over an ambient temperature range.

The Red wavelength laser diode and the infrared wavelength laser diode may be made from a common material. Collimating optics may be provided for the Red wavelength laser diode. The collimating optics may be thermally coupled with the cooling device. Alternatively, the collimating optics may be thermally removed from the cooling device.

Wavelength stabilization may be provided for the Red wavelength laser diode. The stabilization may be made up of an external volume Bragg-grating device and/or an internal WST grating device.

A Blue wavelength laser diode may be coupled with the cooling device. A sub-mount holder may commonly hold the laser diodes. A housing may hermetically seal the laser diodes. A particular gas may be enclosed in the housing. A hermetically sealed cover may be provided over an opening in the housing. Electrodes may penetrate the housing, the electrodes supplying electrical power to the laser diodes.

A RGB (red-green-blue) wavelength laser light source, according to another aspect of the invention, includes a Composite Green wavelength laser and a Red wavelength laser combined in a thermally stabilized source. A Blue wavelength laser is provided with at least one optical component combining outputs of the lasers into a common beam. An optical power detector monitors the common beam and adjusts the lasers to maintain White balance.

A de-speckling component may be provided that is adapted to reduce speckling in the common beam. The Blue wavelength laser may be combined with the Green wavelength laser and the Red wavelength laser in a common package. The Composite Green wavelength laser pumped by an infrared wavelength laser diode, and the infrared wavelength laser diode and the Red wavelength laser diode may be coupled to a common cooling device (TEC).

These and other objects, advantages and features of this invention will become apparent upon review of the following specification in conjunction with the drawings.

DESCRIPTION OF THE PREFERRED EMBODIMENT

Figure 1:
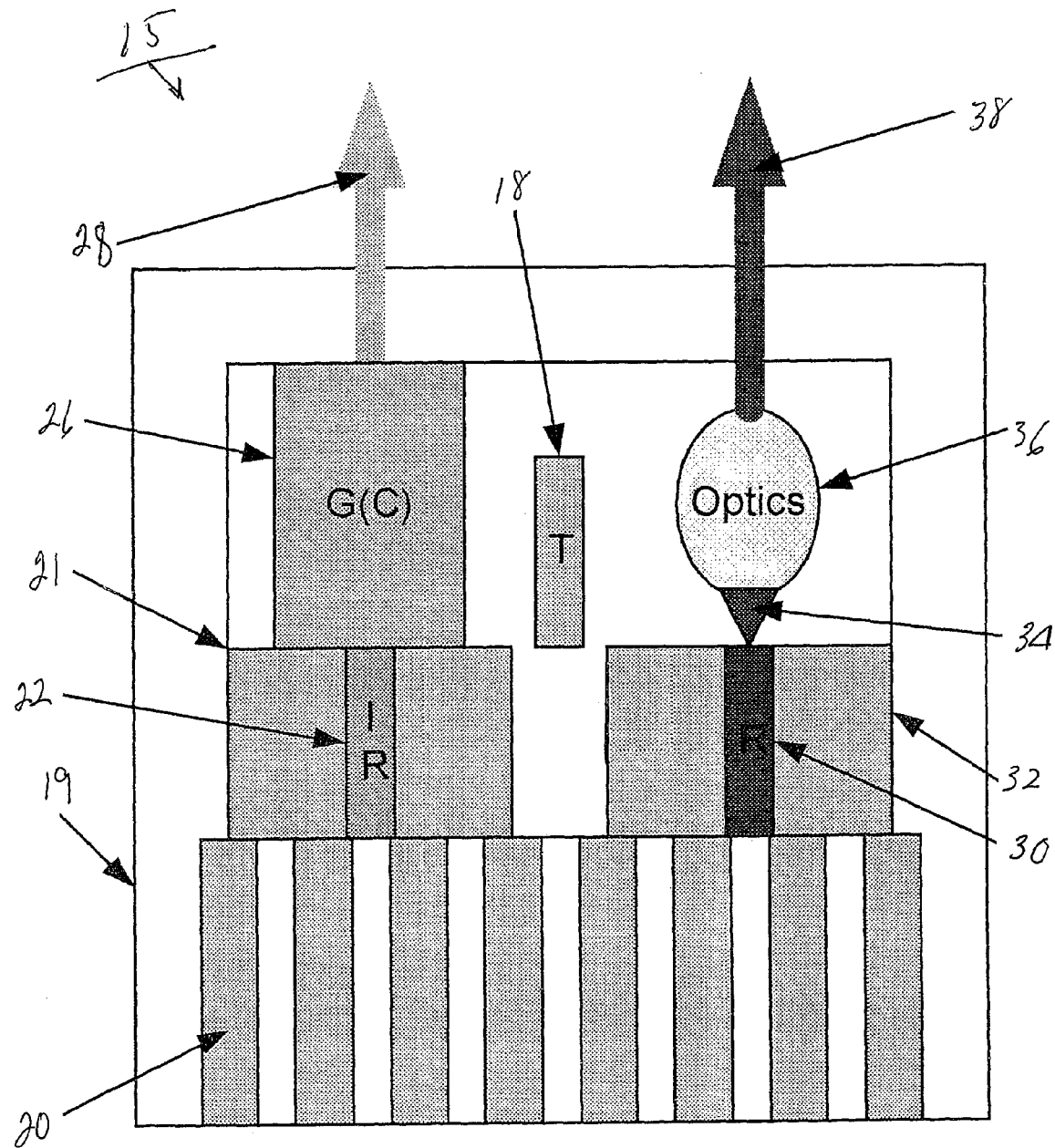
FIG. 1 is a block diagram of a layout of a laser light source combining a Composite Green wavelength laser pumped by an infrared wavelength laser diode and a Red wavelength laser diode in a unitary package.

Referring now to the drawings and the illustrative embodiment depicted therein, a laser light source 15 includes a thermoelectric cooling device (TEC) 16, which is controlled in a feedback loop in response to the temperature sensed by a thermistor 18 (FIG. 1). A set of electrodes 20 supply electrical power to light source 15. A Green wavelength laser source 21 is made up of an infrared (IR) pumped laser diode 22 and microchip assembly 26 that uses nonlinear intra-cavity frequency conversion of the output of IR diode 22 into desired Green wavelength output beam 28 using periodically poled nonlinear crystals, as disclosed in commonly assigned U.S. Pat. No. 7,742,510, the disclosure of which is hereby incorporated herein by reference. A sub-mount 29 mounts IR diode 22 to TEC 16.

Laser light source 15 further includes a Red wavelength laser diode (LD) 30 mounted by a sub-mount 32 to TEC 16 to produce an un-collimated Red wavelength beam 34. Collimating optics 36 are provided in the same housing 19 to produce a Red wavelength output beam 38. Thus, laser light source 15 provides a laser assembly using the same package for housing two lasers Red and Composite Green. The Green composite laser has a round almost collimated beam. The Red LD has an asymmetric highly divergent beam. Optical components are used for the Red beam to be collimated and directed toward the imaging panel. These optical components can be placed on the TEC 16 surface in front of the Red LD next to the Composite Green laser.

Figure 2:
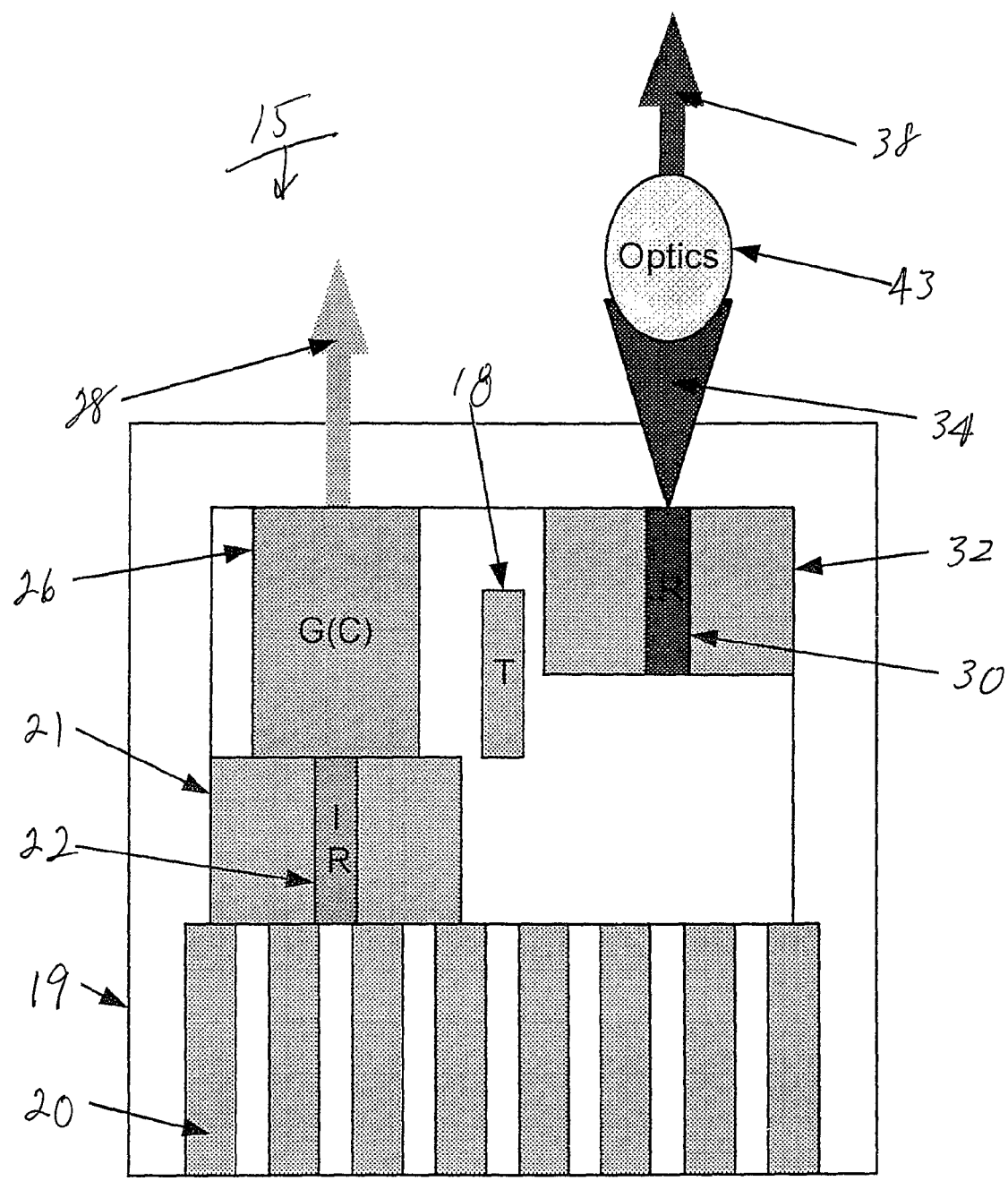
FIG. 2 is the same view as FIG. 1 with the collimating optics for the Red wavelength laser diode outside of the package.
Figure 3:
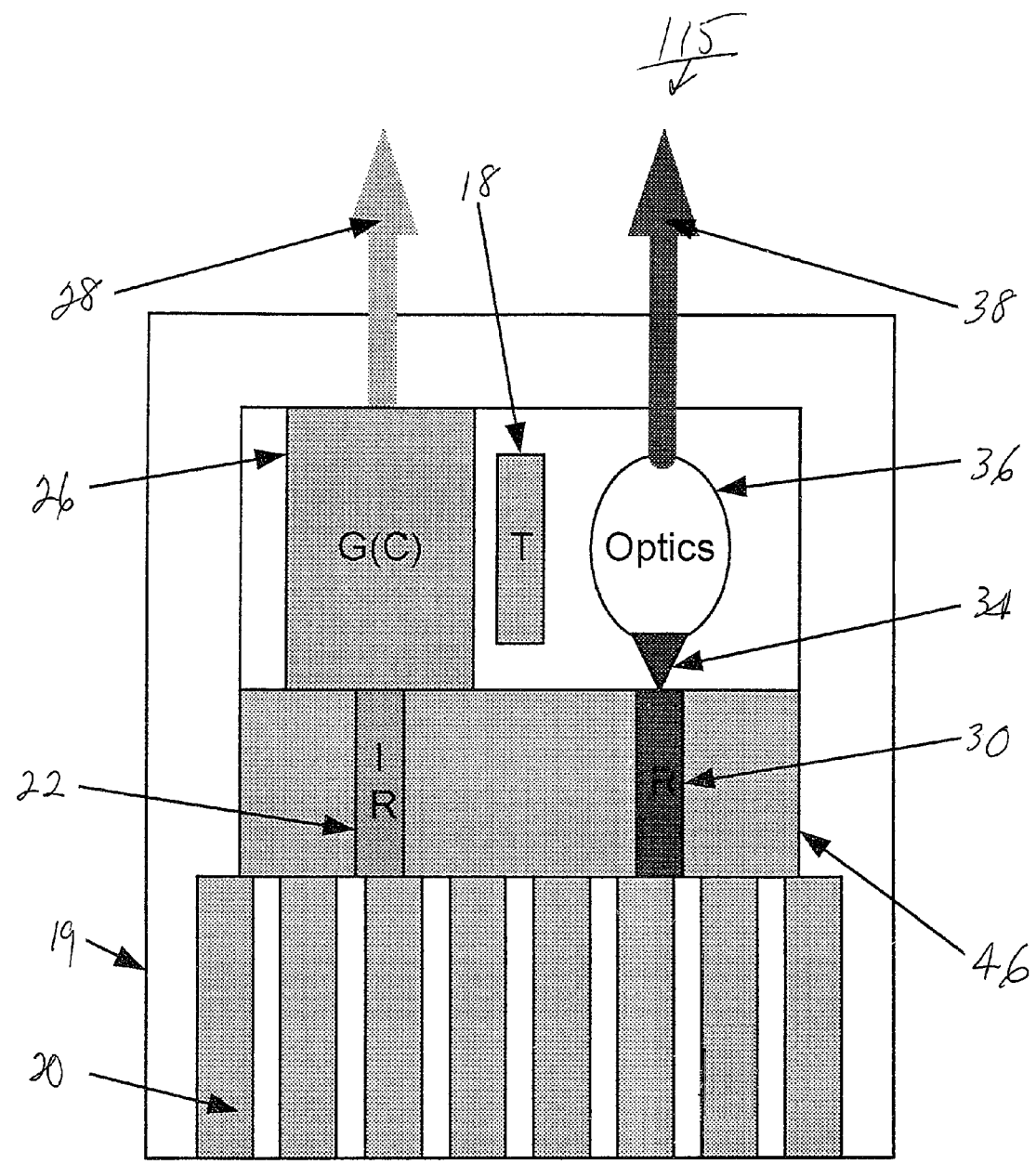
FIG. 3 is the same view as FIG. 1 with a single sub-mount for the lasers.

Red LD 30 will reside on the same TEC 16 surface as the IR pump LD 22 of the Green composite laser 21. The temperature of both LDs will be maintained at a fixed value required for efficient operation of both Green and Red lasers across a wide ambient temperature range. Additional power consumption by TEC 16 will be much lower than the additional power consumption of the Red LD required for maintaining color balance. TEC 16 will minimize power consumption in the middle of the required ambient temperature range, such as around 20° C.-25° C. As seen in FIG. 2, collimating optics 44 can be positioned outside of housing 19.

Figure 4:
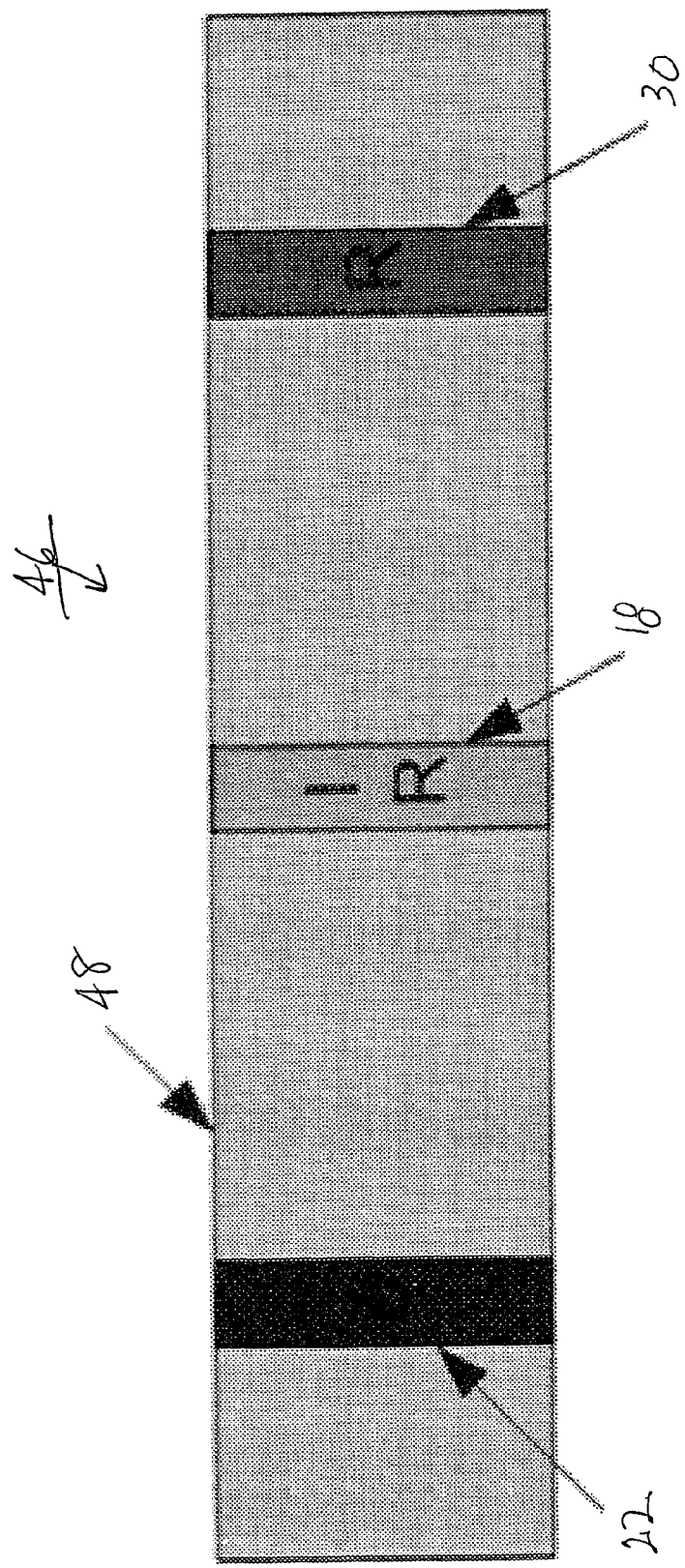
FIG. 4 is a layout of the sub-mount in FIG. 3.

As both Red LD 30 and IR LD 22 are based on the same material, they can be mounted on a common sub-mount 48 at an appropriate distance from each other to form a sub-mount assembly 46 (FIG. 4). The use of a common sub mount assembly will allow for the Composite Green laser microchip assembly 26 and collimating optics 36 for Red LD 30 to not interfere with each other. Common sub-mount assembly 46 may include thermistor 18 mounted to common sub-mount 48.

Figure 5:
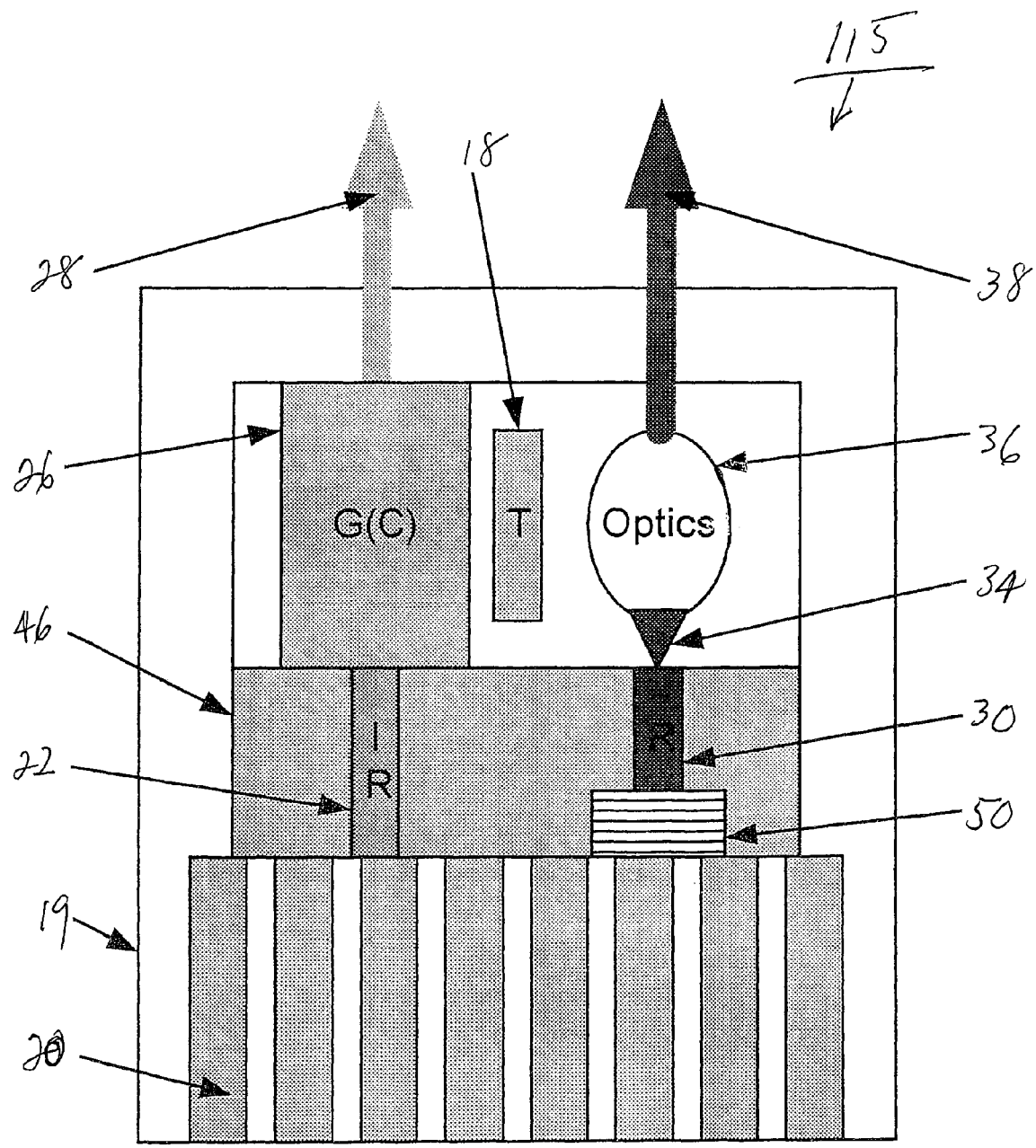
FIG. 5 is the same view as FIG. 3 in which the Red wavelength laser diode beam is stabilized using either external volume Bragg grating or internal WST grating.

An alternative embodiment of a laser light source 115 includes a wavelength stabilization device 50 for Red LD 30 (FIG. 5). Wavelength stabilization device 50 may be a volume Bragg grating or internal grating for stabilization of color balance of RG laser light source.

Figure 6:
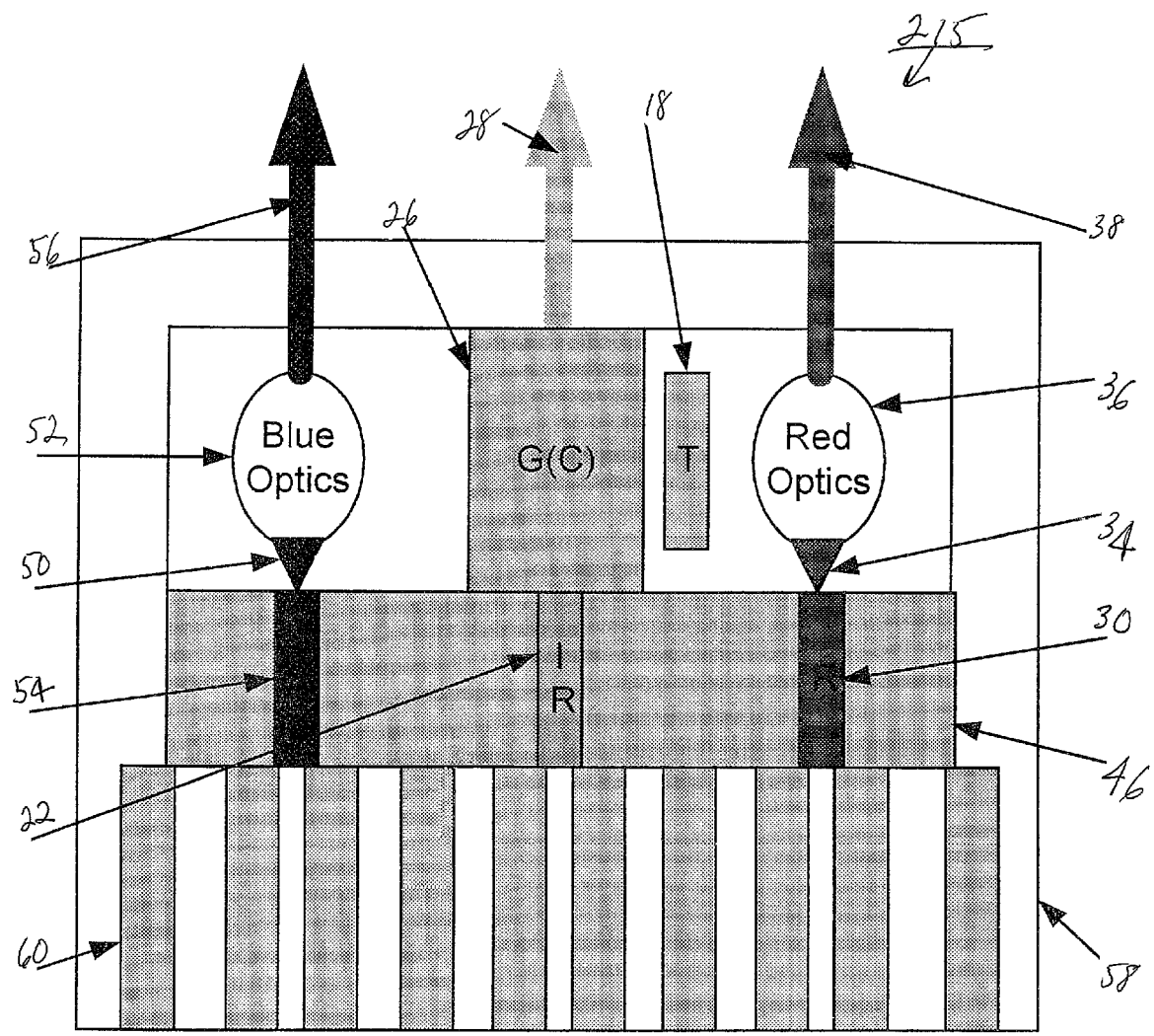
FIG. 6 is the same view as FIG. 3 of a laser light source in which a single sub-mount holds a Blue wavelength laser, a Composite Green wavelength laser comprising an infrared wavelength pumped laser diode and a Red wavelength laser diode.
Figure 7:
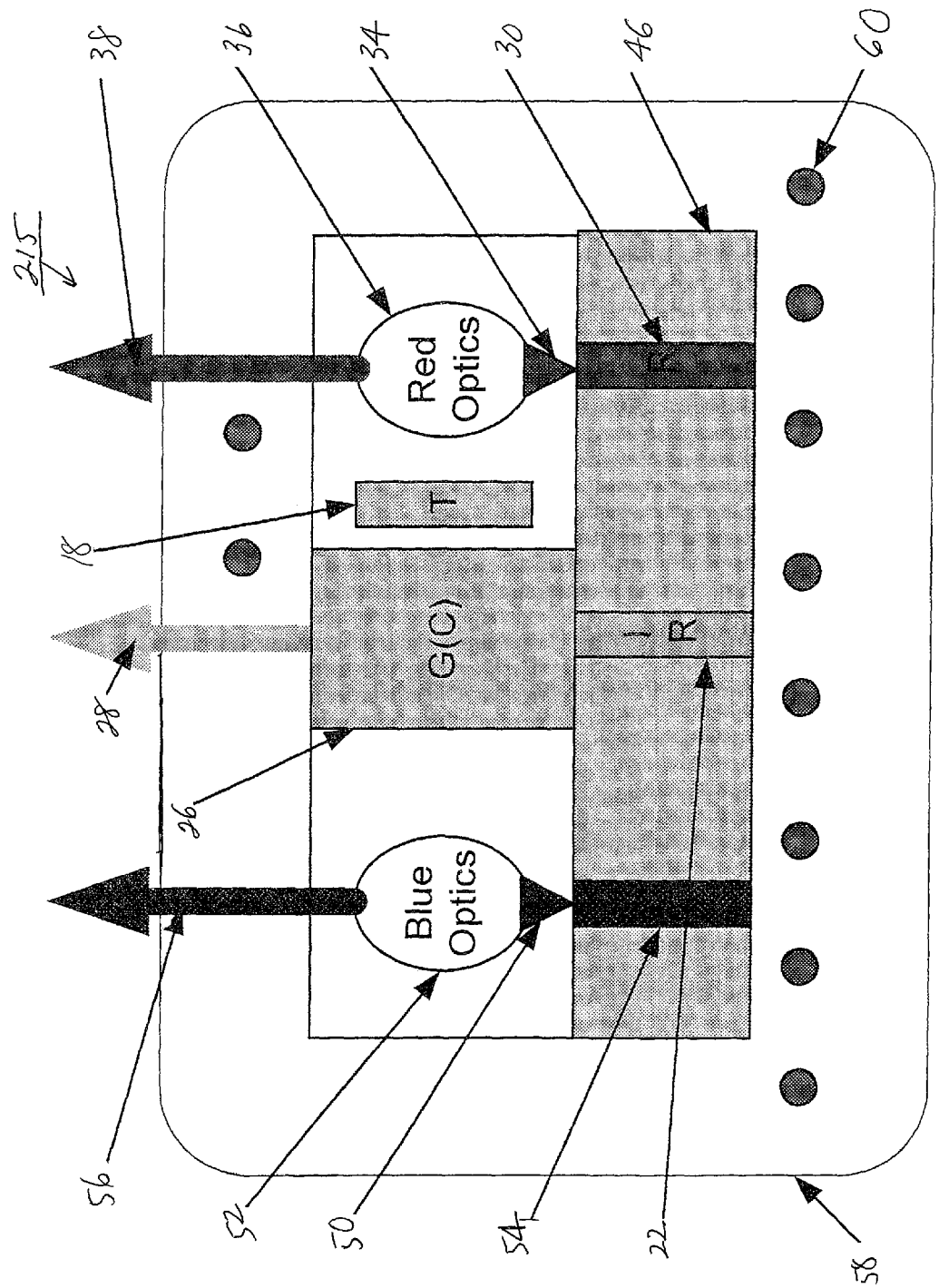
FIG. 7 is the same view as FIG. 6 including a hermetically sealed package and special atmosphere inside the package.

As was mentioned above, Blue wavelength LD power consumption and efficiency does not change very much across the whole temperature range. However, as the temperature of the LD case increases, lifetime of the LD decreases. Thus, as shown in FIGS. 6 and 7, a RBG laser light source 215 includes a Blue wavelength LD 54 also mounted on the TEC 16 in order to produce a Blue wavelength output beam 56. Since the Blue LD 54 is based on a different material (GaN), mounting of the Blue LD 54 in the package includes filling of package 19 with specific gases to maintain required lifetime. As GaAs LDs 22 and 30 do not require such handling, all LDs 22, 30 and 54 and Composite Green laser microchip assembly 26 may be in the same package 219 (FIG. 7). Package 219 includes feed-through electrodes 60 fed through a fixes portion of package 219 and a hermetically sealed cover (not shown) to retain the special atmosphere inside of package 219.

Figure 8:
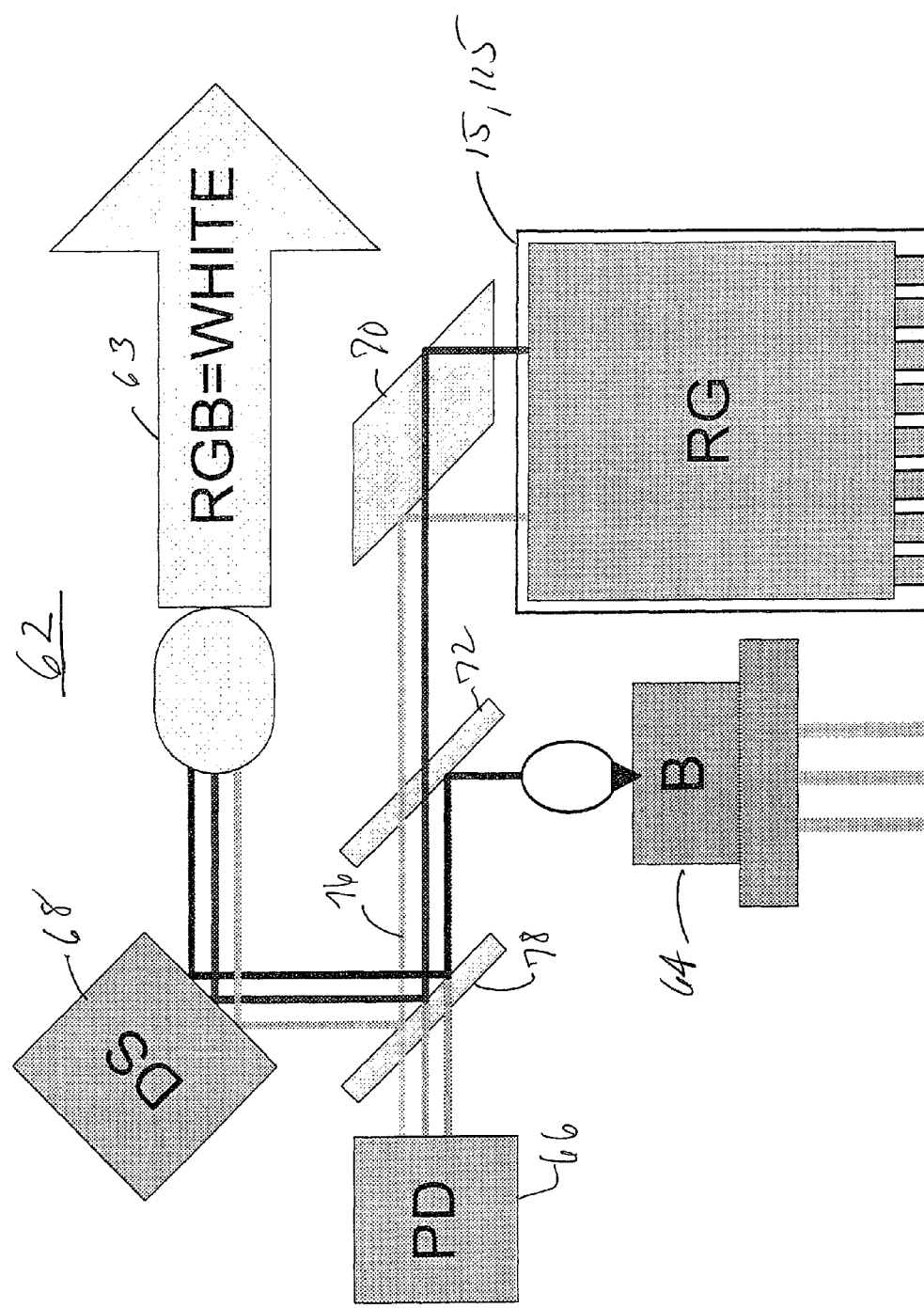
FIG. 8 is an optical diagram of a RGB-White light source that is color balanced over a wide temperature range.
Figure 9:
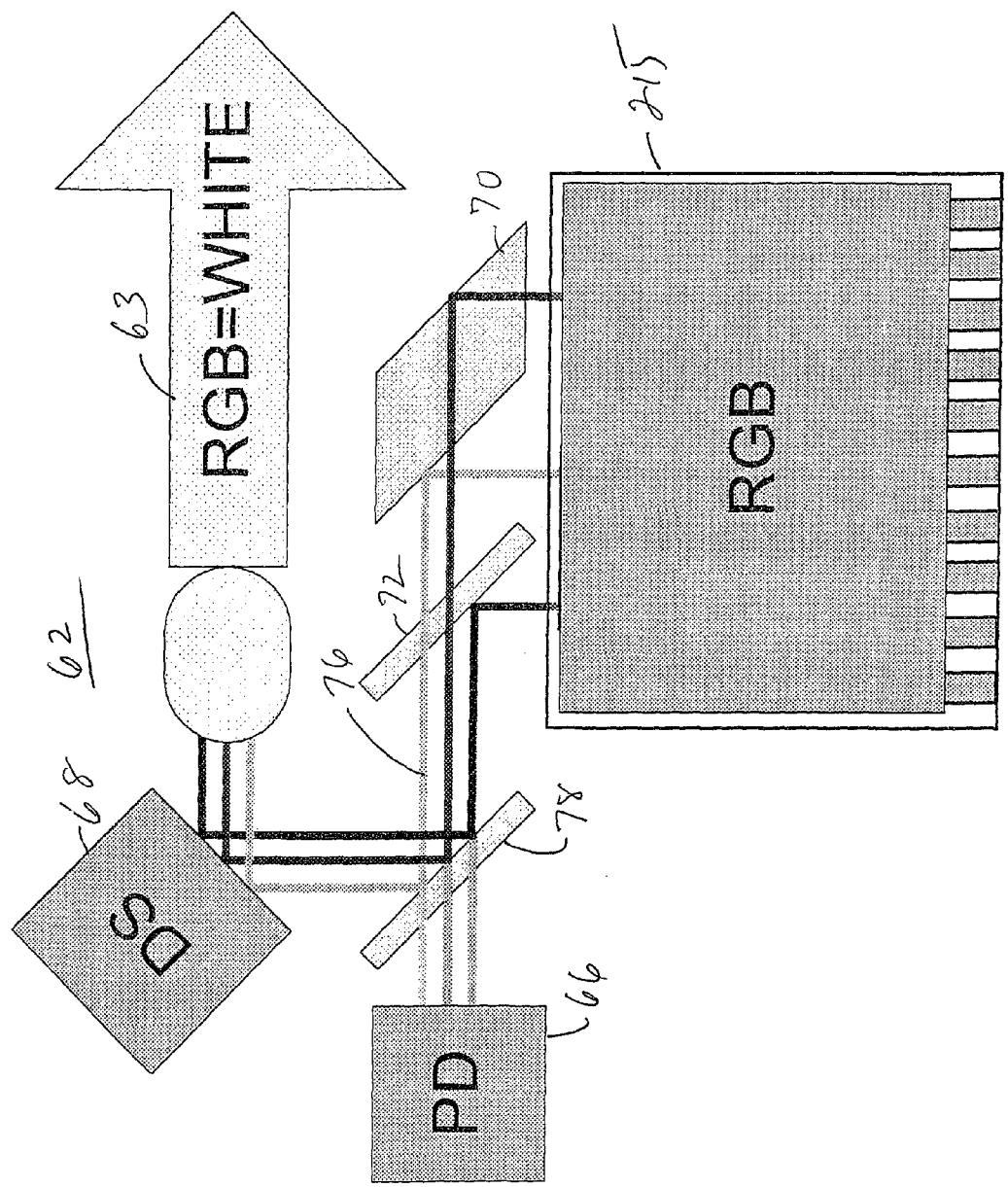
FIG. 9 is the same view as FIG. 8 of an alternative embodiment of a RGB-White light source.

An RGB laser source 62 would make White beam 63 in a more compact, more efficient, low cost and color-balanced manner over a wide temperature range (FIGS. 8 and 9). RGB laser source 62 makes use of the Red LD stabilization of light sources 15 and 115. RGB laser source 62 may include a separate Blue LD 64, as shown in FIG. 8, or a combination light source 215, as shown in FIGS. 6 and 7. RGB laser source 62 includes one or more optical components, such as reflecting surface 70 and partially reflecting surface 72 to combine outputs of lasers 15, 115 and or a Blue wavelength LD 64 into a common beam 76. A power-monitoring photodiode 66 monitors common beam 76 via a partially reflective surface 78 and adjusts lasers 15, 115 and/or 64 to maintain White balance. A speckling reduction component 68 is coupled to beam 76 to reduce speckle in the common beam.

While the foregoing description describes several embodiments of the present invention, it will be understood by those skilled in the art that variations and modifications to these embodiments may be made without departing from the spirit and scope of the invention, as defined in the claims below. The present invention encompasses all combinations of various embodiments or aspects of the invention described herein. It is understood that any and all embodiments of the present invention may be taken in conjunction with any other embodiment to describe additional embodiments of the present invention. Furthermore, any elements of an embodiment may be combined with any and all other elements of any of the embodiments to describe additional embodiments.

The embodiments of the invention in which an exclusive property or privilege is claimed are defined as follows:

1. An RBG white laser light source, comprising:
   a thermoelectric cooling device;
   a composite green laser pumped by an infrared wavelength laser diode thermally coupled with said cooling device (TEC); and
   a red wavelength laser diode thermally coupled with said cooling device (TEC), wherein said cooling device maintains a common stabilized temperature of said infrared pumped laser diode and said red laser diode over an ambient temperature range; and
   a blue wavelength laser diode coupled with said cooling device;
   wherein said red wavelength laser diode and said pump infrared wavelength laser diode are made from a common material and said TEC providing wavelength stabilization of said pumped infrared wavelength laser diode and said red wavelength laser diode, said common material being GaAs.

2. The laser light source as claimed in claim 1 including wavelength stabilization for said red wavelength laser diode with an internal grating device.

3. The laser light source as claimed in claim 2 wherein said stabilization comprises an internal WST grating device.

4. The laser light source as claimed in claim 1 including a sub-mount holder commonly holding said infrared wavelength laser diode, said red wavelength diode and said blue wavelength diodes.

5. The laser light source as claimed in claim 1 including a housing hermetically sealing said laser diodes.

6. The laser light source as claimed in claim 5 including a particular gas in said housing.

7. The laser light source as claimed in claim 5 including a hermetically sealed cover over an opening in said housing.

8. The laser light source as claimed in claim 5 including electrodes penetrating said housing, said electrodes supplying electrical power to said laser diodes and to TEC.

9. The laser light source as claimed in claim 1 including at least one optical component combining outputs of said lasers into a common beam, and a power-monitoring photodiode monitoring said common beam and adjusting said lasers to maintain white balance.

10. The laser light source in claim 9 including wavelength stabilization for said red wavelength laser diode with an internal grating device and a de-speckling component that is adapted to reduce speckle in said common beam.

11. The laser light source in claim 9 wherein said blue wavelength laser is combined with said green wavelength laser and said red wavelength laser in a common package.

12. A RGB-white laser light source, comprising:
   a composite green wavelength laser and a red wavelength laser combined in a thermally stabilized source;
   a blue wavelength laser;
   at least one optical component combining outputs of said lasers into a common beam;
   a power-monitoring photodiode monitoring said common beam and adjusting said lasers to maintain White balance; and
   wavelength stabilization for said red wavelength laser with an internal grating devise and a de-speckling component that is adapted to reduce speckle in said common beam.

13. The RGB-white laser light source as claimed in claim 12 wherein said blue wavelength laser is combined with said green wavelength laser and said red wavelength laser in a common package.

14. The RGB-white laser light source as claimed in claim 13 wherein said composite green wavelength laser comprises a pumped infrared wavelength laser diode and wherein said pumped infrared wavelength laser diode and said red wavelength laser diode are attached to a common cooling device (TEC).

15. The RGB-white laser light source as claimed in claim 12 wherein said composite green wavelength laser comprises a pumped infrared wavelength laser diode and wherein said pumped infrared wavelength laser diode and said red wavelength laser diode are attached to a common cooling device (TEC).

* * * * *